(12) United States Patent
Lee et al.

(10) Patent No.: US 12,111,361 B2
(45) Date of Patent: Oct. 8, 2024

(54) METHOD AND APPARATUS WITH BATTERY SHORT CIRCUIT DETECTION

(71) Applicant: SAMSUNG ELECTRONICS CO., LTD., Suwon-si (KR)

(72) Inventors: Myeongjae Lee, Seoul (KR); Jinho Kim, Yongin-si (KR); Ju Wan Lim, Suwon-si (KR); Youngjae Kim, Seoul (KR); Young Hun Sung, Hwaseong-si (KR); Tae Won Song, Yongin-si (KR); Terrance Christopher Huang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 128 days.

(21) Appl. No.: 17/874,794

(22) Filed: Jul. 27, 2022

(65) Prior Publication Data
US 2023/0194616 A1 Jun. 22, 2023

(30) Foreign Application Priority Data
Dec. 20, 2021 (KR) ........................ 10-2021-0182920

(51) Int. Cl.
*G01R 31/367* (2019.01)
*G01R 31/3835* (2019.01)
(Continued)

(52) U.S. Cl.
CPC ....... *G01R 31/367* (2019.01); *G01R 31/3835* (2019.01); *G01R 31/52* (2020.01);
(Continued)

(58) Field of Classification Search
None
See application file for complete search history.

(56) References Cited

U.S. PATENT DOCUMENTS

| 10,788,536 B2 | 9/2020 | Zhang et al. |
| 10,908,227 B2 | 2/2021 | Ling et al. |
| (Continued) | | |

FOREIGN PATENT DOCUMENTS

| CN | 110907843 A | 3/2020 |
| CN | 112924885 A | 6/2021 |
| (Continued) | | |

OTHER PUBLICATIONS

Extended European search report issued on May 22, 2023, in counterpart European Patent Application No. 22206142.6 (38 pages in English).

*Primary Examiner* — Jas A Sanghera
(74) *Attorney, Agent, or Firm* — NSIP Law

(57) ABSTRACT

A method and apparatus with battery short circuit detection are included. In one general aspect, a processor-implemented method includes, based on battery data measured by a battery and a battery model of the battery, determining a detection parameter value used for detecting a short circuit of the battery and a variation factor value correlated with the detection parameter, using the variation factor to extract a reference value corresponding to the detection parameter value from a reference data set, and determining whether a short circuit of the battery has occurred based on a result of comparing the detection parameter value with the reference value.

28 Claims, 13 Drawing Sheets

(51) Int. Cl.
  *G01R 31/52* (2020.01)
  *H02J 7/00* (2006.01)
(52) U.S. Cl.
  CPC ...... *H02J 7/0048* (2020.01); *H02J 7/007182* (2020.01); *H02J 7/007192* (2020.01)

(56) References Cited

U.S. PATENT DOCUMENTS

| | | |
|---|---|---|
| 10,948,544 B2 | 3/2021 | Sun et al. |
| 11,035,904 B2 | 6/2021 | Cho et al. |
| 11,041,914 B2 | 6/2021 | Cho et al. |
| 2010/0073176 A1* | 3/2010 | Li ................. G01R 31/36 340/650 |
| 2010/0201321 A1 | 8/2010 | Asakura et al. |
| 2014/0120389 A1* | 5/2014 | Fink ............... H01M 10/425 324/426 |
| 2018/0328998 A1* | 11/2018 | Zhang ............ G01R 31/3842 |
| 2019/0219640 A1 | 7/2019 | Liu et al. |
| 2019/0305384 A1 | 10/2019 | Liu et al. |
| 2021/0239766 A1 | 8/2021 | Talukdar et al. |

FOREIGN PATENT DOCUMENTS

| | | |
|---|---|---|
| KR | 10-2010-0050514 A | 5/2010 |
| KR | 10-1930647 B1 | 3/2019 |
| KR | 10-2020-0024637 A | 3/2020 |
| KR | 10-2020-0101754 A | 8/2020 |
| KR | 10-2238559 B1 | 4/2021 |
| KR | 10-2266591 B1 | 6/2021 |
| KR | 10-2283954 B1 | 7/2021 |
| KR | 10-2022-0089969 A | 6/2022 |
| WO | WO 2021/006566 A1 | 1/2021 |

* cited by examiner

| Serial number | Battery data | | | Discharge cut-off voltage | Detection parameter (Change in cumulative correction value) | Candidate reference value (Change in cumulative correction value) | | | Short circuit state |
|---|---|---|---|---|---|---|---|---|---|
| | Voltage | Current | Temperature | | | | | | |
| 1 | MV1 | MI1 | MT1 | CV1 | C1 | RC11 | RC12 | RC13 | 0 |
| 2 | MV2 | MI2 | MT2 | CV2 | C2 | RC21 | RC22 | RC23 | 0 |
| 3 | MV3 | MI3 | MT3 | CV3 | C3 | RC31 | RC32 | RC33 | 0 |
| 4 | MV4 | MI4 | MT4 | CV4 | C4 | RC41 | RC42 | RC43 | 0 |
| 5 | MV5 | MI5 | MT5 | CV5 | C5 | RC51 | RC52 | RC53 | 0 |
| 6 | MV6 | MI6 | MT6 | CV6 | C6 | RC61 | RC62 | RC63 | 0 |
| 7 | MV7 | MI7 | MT7 | CV7 | C7 | RC71 | RC72 | RC73 | 0 |
| ... | ... | ... | ... | ... | ... | ... | ... | ... | ... |

FIG. 5

METHOD AND APPARATUS WITH BATTERY SHORT CIRCUIT DETECTION

CROSS-REFERENCE TO RELATED APPLICATIONS

This application claims the benefit under 35 USC § 119(a) of Korean Patent Application No. 10-2021-0182920, filed on Dec. 20, 2021, in the Korean Intellectual Property Office, the entire disclosure of which is incorporated herein by reference for all purposes.

BACKGROUND

1. Field

The following description relates to a method and apparatus with battery short circuit detection.

2. Description of Related Art

A battery short circuit can deteriorate battery efficiency, cause thermal runaway of the battery, and cause a safety problem such as battery explosion. Therefore, it can be helpful for battery safety to effectively detect a short circuit before the short circuit causes an increase in physical and thermal deformation of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented method includes, based on battery data measured by a battery and a battery model of the battery, determining a detection parameter value used for detecting a short circuit of the battery and a variation factor value correlated with the detection parameter, using the variation factor to extract a reference value corresponding to the detection parameter value from a reference data set, and determining whether a short circuit of the battery has occurred based on a result of comparing the detection parameter value with the reference value.

The detection parameter value may correspond to either a change in an error in voltage estimation, a change in a cumulative error in voltage estimation, a change in a correction value of a voltage error, a change in a cumulative correction value of a voltage error, a voltage change, a current change, a capacity change, a temperature change, a short circuit resistance value, or a short circuit current value.

A battery model may be used to obtain the detection parameter value.

The detection parameter value may correspond to a change in a cumulative correction value of a state of charge (SOC) during a target time period of constant voltage (CV) charging, and the variation factor may include a discharge cut off voltage and/or a charge temperature of the target section.

The change in the cumulative correction value may correspond to a difference between a first cumulative correction value at a start point of the target time period and a second cumulative correction value at an end point of the target time period.

The cumulative correction value may be determined by determining a voltage estimation value by using a battery model, determining an estimation error by comparing the voltage estimation value to the voltage measurement value, and accumulating SOC correction values that reduce the estimation error.

Each data element of the reference data set may include a respective parameter value corresponding to the detection parameter value and a factor value related to the variation factor value, and the extracting of the reference value may include: extracting a data element including the factor item, which is selected from the reference data set based on a proximity to the variation factor, and extracting the parameter item of the selected data element as the reference value.

The factor value may include a plurality of values having respective weights, the extracting of the data element may include extracting the data element based on a distance between the data element and the variation factor, and the distance may be based on the weights.

The reference data set may correspond to a state without a short circuit, and the detecting of the short circuit may include determining that the battery is in a short circuit state when a difference between the detection parameter and the reference value is greater than a threshold.

A battery model may be updated based on modeled degradation of the battery, the reference data may be updated set by using the updated battery model, and the detection parameter value may be determined based on estimated values estimated by using the battery model.

The reference data set may be determined based on a preliminary experimental result, may be determined based on an actual driving result during a sample driving of the battery, or may be determined by applying the actual driving result to the preliminary experimental result.

An actual driving result may be obtained by driving the battery during a sample period, and the reference data set may be determined by adjusting a preliminary experimental result based on statistical data based on the actual driving result.

In one general aspect, an apparatus includes a processor configured to, based on battery data measured from a battery and a battery model of the battery, determine a detection parameter value used for detecting a short circuit of the battery and a variation factor value correlated with the detection parameter using the variation factor value, extract a reference value corresponding to the detection parameter value from a reference data set, and detect a short circuit of the battery based on a result of comparing the detection parameter value with the reference value.

The detection parameter value may correspond to a change in an error in voltage estimation, a change in a cumulative error in voltage estimation, a change in a correction value of a voltage error, a change in a cumulative correction value of a voltage error, a voltage change, a current change, a capacity change, a temperature change, a pre-calculated short circuit resistance value, or a pre-calculated short circuit current value.

The detection parameter value may correspond to a change in a cumulative correction value of a state of charge (SOC) during a target time period for which constant voltage (CV) charging is performed, and the variation factor may include a discharge cut off voltage and/or a charge temperature of the target section.

Each data element of the reference data set may include a parameter value corresponding to the detection parameter value and a factor value corresponding to the variation factor value, and the processor may be further configured to extract a data element including the factor value, which is close to the variation factor, from the reference data set, and extract the parameter value of the data element as the reference value.

The reference data set may correspond to a state of the battery without a short circuit, and the processor may be further configured to determine that the battery is in a short circuit state when a difference between the detection parameter value and the reference value is greater than a threshold.

The apparatus may further include the battery.

The detection parameter value may correspond to a change in a cumulative correction value of a state of charge (SOC), and the variation factor value may include a discharge cut off voltage and/or a temperature.

The reference data set may include elements, and each data element may include a respective parameter value corresponding to the detection parameter and a respective factor value corresponding to the variation factor value, and the processor may be further configured to select a data element from the reference data set based on a proximity thereof to the variation factor value, and use the parameter value of the selected data element as the reference value.

The apparatus may be a smartphone including a camera.

In one general aspect, a method includes applying a received measurement of a battery to a battery model to obtain a voltage estimate, comparing the voltage estimate to a measured voltage of the battery to obtain an error of the voltage estimate, obtaining a correction value that corrects the voltage estimate with respect to the measured voltage, and determining that the battery is in a short circuit state based on the correction value.

The determining that the battery is in a short circuit state may include obtaining, from reference data associated with the battery, a reference value corresponding to the correction value, and the determining may be further based on the reference value.

The reference value may correspond to an accumulation of reference correction values.

The reference data may include elements that include respective measures of the battery over time, and each element may have a respectively corresponding detection parameter value, reference parameter value, and candidate reference value.

An element from the reference data may be selected, and determining that the battery is in a short circuit state may be based further on the candidate reference value of the selected element.

A remediation action may be performed based on determining that the battery is in a short circuit state, wherein the remediation action may include generating a notification, changing an operation state of a computing device powered by the battery, or adjusting a feature of the battery.

In one general aspect, a non-transitory computer-readable storage medium stores instructions that, when executed by a processor, cause the processor to perform any of the methods.

Other features and aspects will be apparent from the following detailed description, the drawings, and the claims.

BRIEF DESCRIPTION OF THE DRAWINGS

FIG. 5 illustrates an example of a series of reference data used for detecting a short circuit, according to one or more embodiments.

Figure 1:
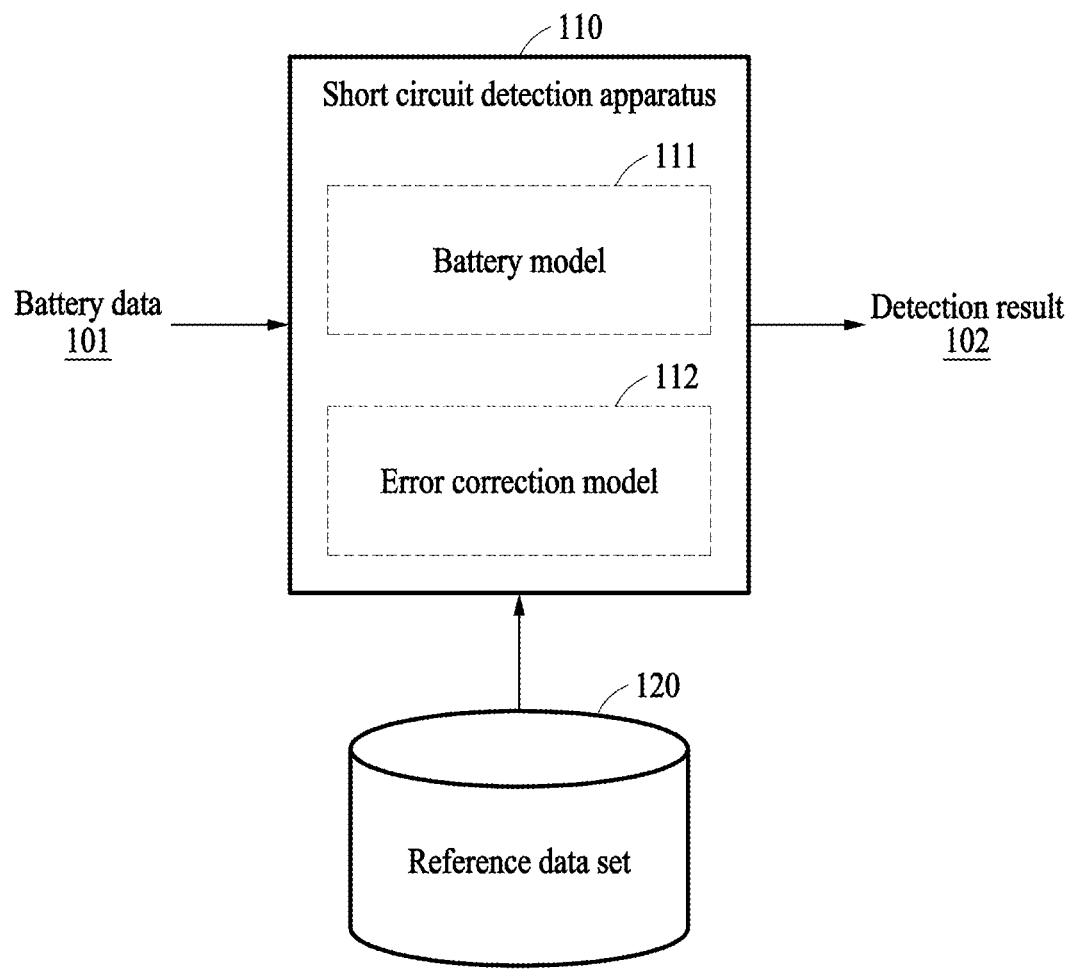
FIG. 1 illustrates an example of a short circuit detection apparatus, according to one or more embodiments.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

In general, a battery has various parameters, for example, current, voltage, capacity, temperature of the battery, etc. A battery parameter may be changed, and such a change may be modeled by an electric circuit model to detect a short circuit of the battery. In addition, various battery parameter deviation values between unit cells constituting a multi-cell can be used to detect a multi-cell battery pack.

FIG. 1 illustrates an example of a short circuit detection apparatus 110, according to one or more embodiments. A short circuit of a battery may deteriorate the energy efficiency of the battery and may cause a safety problem in the battery. In addition, a battery short circuit may be the main cause of thermal runaway of a battery. The initial stage of a battery short circuit may be detected at a micro-short circuit level, which may allow preventative safety measures to be carried out. A change in a battery parameter or battery signal may be useful for detecting a micro short-circuit. However, when a battery micro-short circuit occurs, a corresponding change in a battery signal (for example, a current, a voltage, or a temperature) may be significantly small, which may make it difficult to use the signal. In addition, a change in a battery signal can be correlated with other factors such as the charging/discharging speed of a battery, a charging/discharging range (for example, a voltage range), a temperature, a difference between batteries, battery degradation, and the like. Because a change in a battery signal may appear to be correlated with other factors, it may be difficult to use a change in a battery signal to detect a battery short circuit by calculating an internal short circuit of the battery. The accuracy of detecting a battery short circuit from a battery signal while using a battery may be improved (and the probability of false detection may be reduced) by selecting, from among factors that may affect (or vary in correlation with) the battery signal, a variation factor that affects (or varies with) a short circuit parameter used for short circuit detection (i.e., a detection parameter), storing values of short circuit detection parameters with respective battery conditions based on each of the factors (e.g., in a table), and deriving an effective micro short circuit detection size and a short circuit detection condition.

Referring to FIG. 1, the short circuit detection apparatus 110 may output a battery short circuit detection result 102 that is generated based on battery data 101. The battery data 101 may include data related to a specification and/or an operation of a battery monitored by the short circuit detection apparatus 110. For example, while a battery is charging, the battery data 101 may include a battery signal that is based on charging, and while the batter is discharging, the battery data 101 may include a battery signal based on discharging. For example, the battery signal may include a voltage, a current, and/or a temperature. The battery data 101 may be inferred or may be measured by various sensors inside and/or outside the battery. The detection result 102 may include short circuit information or signals indicating whether a short circuit has been detected, a detection time of the short circuit, a duration of the detected short circuit, and/or an intensity of the short circuit.

The short circuit detection apparatus 110 may determine (e.g., select) a detection parameter value (e.g., from a reference data set 120) used for detecting a short circuit of the monitored battery based on the battery data 101, and may determine (e.g., select) a variation factor value (e.g., from the reference data set 120) that affects (varies in correlation with) the detection parameter value. The reference data set 120 may have elements (e.g., rows), and each element may include a parameter item (e.g., a value in a field) related to the detection parameter value and a factor item (e.g., a value in a field) related to the variation factor value. The short circuit detection apparatus 110 may extract, using the variation factor value, a reference value of a parameter item (value) corresponding to the detection parameter value from the reference data set 120 (e.g., extract a value in the detection parameter field of the row/element), and may detect the short circuit of the battery based on a result of comparing the detection parameter and the extracted reference value.

The reference data set 120 may have rows/elements that correspond to a state of the battery without a short circuit, and the short circuit detection apparatus 110 may determine that the battery is in a short circuit state when a difference between the detection parameter value and the reference value is greater than a threshold value. The state of a battery without a short circuit will be hereinafter referred to as a normal state. The reference data set 120 may also have rows/elements that correspond to a short circuit state, and the short circuit detection apparatus 110 may determine that the battery is in the short circuit state when a difference between the detection parameter and the reference value is less than the threshold value. A representative example of the reference data set 120 having rows/elements corresponding to the normal state is described below with reference to FIG. 5, and the description thereof may also be applicable to an example of the reference data set 120 having rows/elements corresponding to the short circuit state.

The detection parameter may correspond to a change in an error in voltage estimation, a change in a cumulative error in voltage estimation, a change in a correction value of a voltage error, a change in a cumulative correction value of a voltage error, a voltage change, a current change, a capacity change, a temperature change, a short circuit resistance value, or a short circuit current value. The error in voltage estimation may be an error of a voltage estimation obtained from the battery model 111. An error correction value may represent a correction value based on error correction performed by an error correction model 112. The variation factor may correspond to a charge/discharge temperature, a charge/discharge range (for example, a voltage range), or a charge/discharge speed.

Although the detection parameter and variation factor may correspond to various battery parameters noted above, in examples described below (i) the detection parameter corresponds to a change in a cumulative correction value of a state of charge (SOC) during a target section (time period) in which constant voltage (CV) charging is performed, and (ii) the variation factor corresponds to a discharge cut off voltage when a discharge state of the battery is terminated before CV charging is performed and/or corresponds to a charge temperature during the target section (time period). However, the descriptions of the examples below are applicable to other examples using different detection parameters and/or different variation factors.

The short circuit detection apparatus 110 may include the battery model 111 and/or the error correction model 112. The short circuit detection apparatus 110 may determine a detection parameter value and/or a variation factor value by using the battery model 111 and/or the error correction model 112.

The battery model 111 may be an electrochemical thermal (ECT) model. The ECT model may simulate an internal state of the battery by using various ECT parameters and governing equations. For example, the parameters of the ECT model may indicate a shape (for example, a thickness, a radius), an open circuit potential (OCP), and physical properties (for example, electrical conductivity, ionic conductivity, and diffusion coefficient). The governing equations may include an electrochemical reaction occurring between an electrode and an interface of an electrolyte based on these parameters, and a physical conservation equation associated with the electrode and a conservation of a concentration of the electrolyte and electrical charges.

The ECT model may estimate a state (for example, an SOC, a voltage) of the battery based on the measured battery data 101. In other words, the ECT model may extrapolate state of the battery from the measured battery data 101. For example, the ECT model may estimate an SOC and a voltage of the battery based on a current and a temperature of the battery in the measured battery data 101. The short circuit detection apparatus 110 may detect a short circuit state through an error (difference) between measured data in the battery data 101 and estimated data produced by the battery model 111. This error may be referred to as an estimation error. The error correction model 112 may correct the estimation data to reduce the estimation error (i.e., by correcting the estimation data, e.g., voltage, to be closer to ground truth). For example, the error correction model 112 may correct a voltage estimate and/or an SOC estimate such that an error between a voltage estimate and a voltage measurement is reduced. As the error increases, the correction value may increase in correlation therewith. As described below, the short circuit detection apparatus 110 may use a change in the correction value and/or a change in the error corresponding to time period for short circuit detection.

The detection parameter value may be affected by (or change in correlation with) the variation factor value as well as degradation of the battery. For example, in case of rapid battery degradation, an amount of cumulative SOC correction in a CV charging section may increase positively. In this case, the accuracy of short circuit detection may benefit from adjusting the reference data set 120 to reflect the battery degradation modeled in the battery model 111. Specifically, the short circuit detection apparatus 110 may update the battery model 111 based on the modeled battery degradation, and may update the reference data set 120 using the updated battery model 111.

Figure 2:
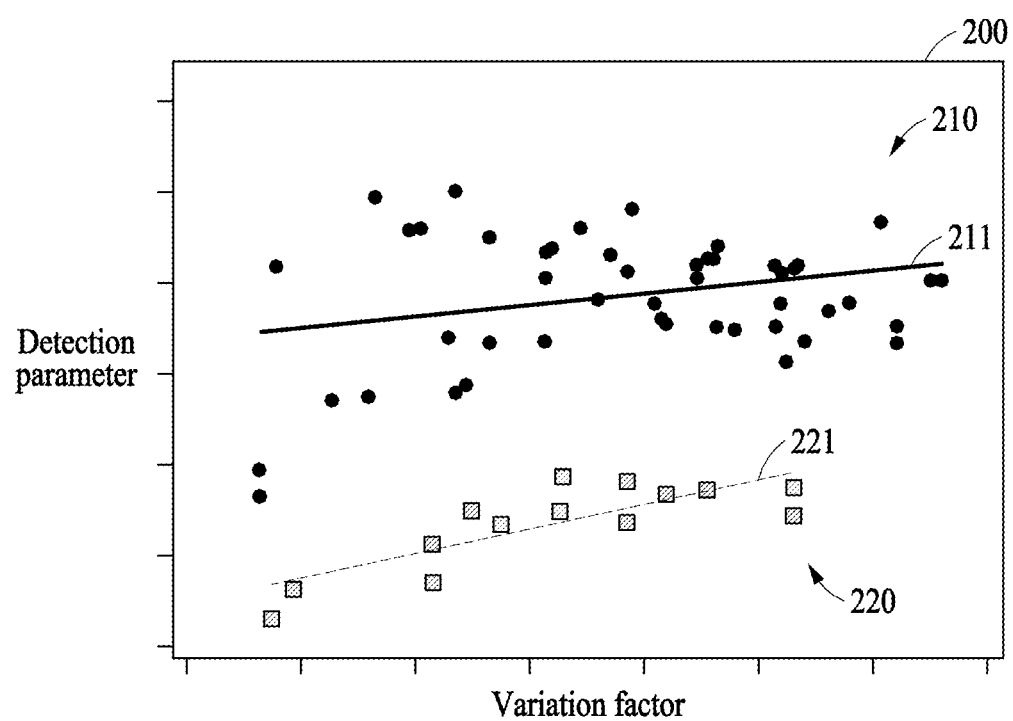
FIG. 2 illustrates an example of detection parameter values in a normal state and in a short circuit state, according to one or more embodiments.

FIG. 2 illustrates an example of detection parameter values in a normal state and in a short circuit state, according to one or more embodiments. Referring to FIG. 2, in graph 200, a first parameter value group 210 may correspond to values of the detection parameter in a battery's normal state and a second parameter value group 220 may correspond to values of the detection parameter in a short circuit state of the battery. A first line 211 may represent a distribution of the values in the first parameter value group 210, and a second line 221 may represent a distribution of the values in the second parameter value group 220. For example, the first and second lines 211 and 221 may correspond to averages of the values first and second parameter value groups 210 and 220 respectively.

Detection parameter values of the first and second parameter values groups 210 and 220 may be obtained by adjusting a variation factor. Consider an example where the detection parameter corresponds to a change in a cumulative correction value of an SOC in a target section (time period) during which CV charging is performed. The cumulative correction value may be determined by first determining a voltage estimation value by using a battery model, then determining an estimation error by comparing the voltage estimation value with a voltage measurement value, and then accumulating SOC correction values that reduce the estimation error. A change in such accumulated correction values may correspond to a difference between a first cumulative correction value at a start point of the target section (time period) and a second cumulative correction value at an end point of the target section (time period). The variation factor may correspond to a discharge temperature of the target section. The charge temperature may correspond to an average temperature of the target section, or a temperature at a predetermined point in time (for example, an end point) of the target section.

Values in the first parameter value group 210 and values in the second parameter value group 220 may be differentiated from one another based on a gap between the first line 211 and the second line 221. For example, a threshold to differentiate the first and second parameter groups 210 and 220 may be set to a difference between the first and second lines 221 and 221, or may be set by comparing minimum parameter values in the normal state to maximum parameter values in the short circuit state over respective sections of the variation factor. The threshold, set as described above, may be used for short circuit detection while driving the battery. For example, in a predetermined temperature section, a difference between an SOC cumulative correction value in the normal state and an SOC cumulative correction value in the short circuit state (e.g., 0.001) may be set as the threshold. Later, during actual driving of the battery, the battery may be determined to be in the short circuit state if the measurement-based cumulative correction value is greater than or equal to 0.001 in the predetermined temperature section.

Figure 3:
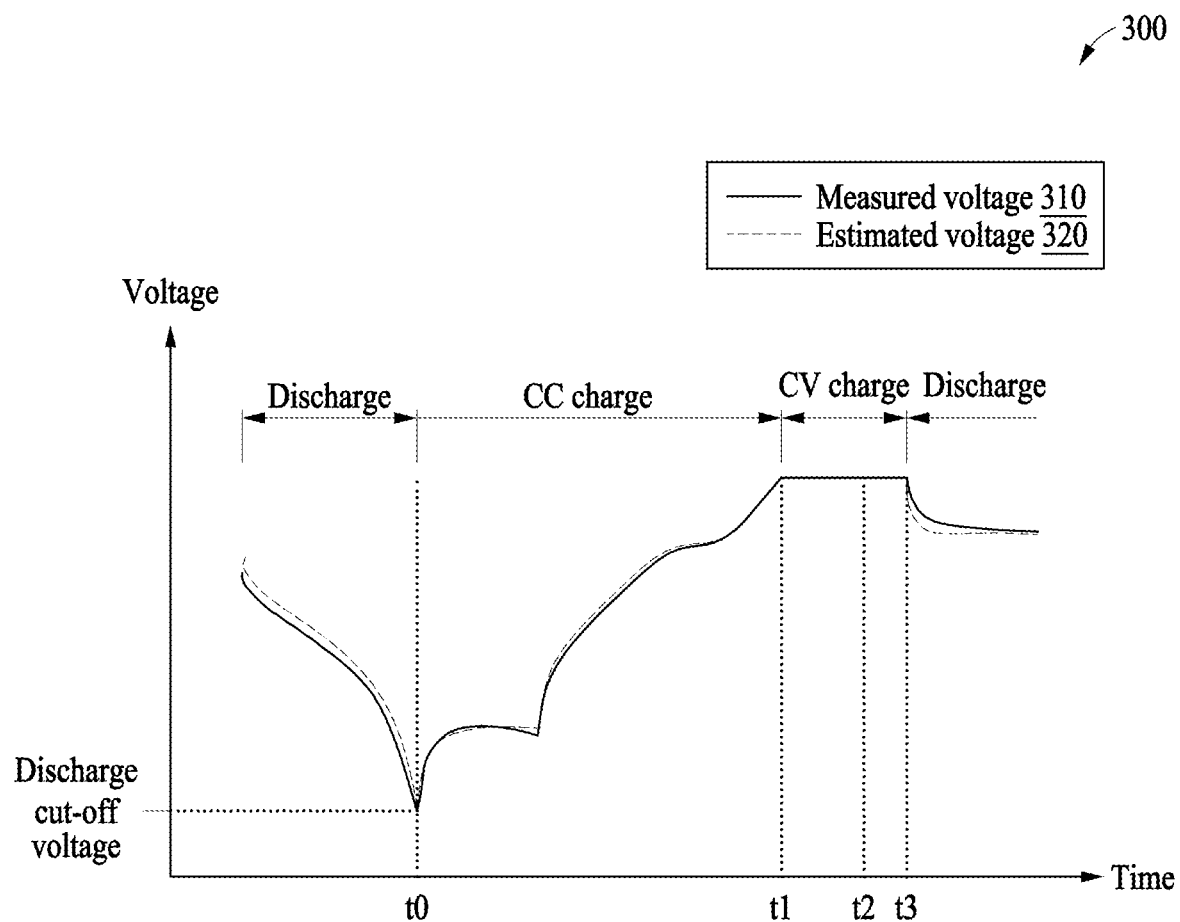
FIG. 3 illustrates an example of obtaining a detection parameter value, according to one or more embodiments.

FIG. 3 illustrates an example of obtaining a detection parameter value, according to one or more embodiments. Referring to FIG. 3, in graph 300, a first line 310 may correspond to measured voltage over time and a second line 320 may correspond to estimated voltage over time. A time point t0 may represent an end point of discharging a battery, and a time point t3 may represent an end point of charging the battery. In the example shown in FIG. 3, at the time point t0, the battery changes from a discharging state to a charging state, and at the time point t3, the state of the battery changes from the charging state to the discharging state. During the period from time point t0 to a time point t1, constant current (CC) charging is performed. Based on an assumption that a voltage of the battery has reached a required level for CV charging at the time point t1, CV charging may be performed during a period from the time point t1 to the time point t3. In the graph 300, for any time interval, the measured voltages (the first line 310) and the respective estimated voltages (second line 320) may have respective differences, whether discharging or charging, and the differences may be reduced by continuous error correction.

In the example of FIG. 3, as noted, the detection parameter may correspond to a cumulative correction value of an SOC in the target section during which CV charging is performed. For example, the target section may be a time period from the time point t1 to the time point t2, or a time period from the time point t1 to the time point t3. The time point t2 may correspond to a reference point at which a current of the battery reaches a predetermined level. The target section may be defined in various ways as noted above. A change in a cumulative correction value may correspond to a difference between a cumulative correction value of a start point (for example, the time point t1) of the target section and a second cumulative correction value of an end point (for example, the time point t2 or the time point t3) of the target section. As noted above, alternatively, the detection parameter may correspond to a change in an error in voltage estimation, a change in a cumulative error in voltage estimation, a change in a correction value of a voltage error, a voltage change, a current change, a capacity change, a temperature change, a pre-calculated short circuit resistance value, or a pre-calculated short circuit current value. In case where an SOC cumulative correction amount is used as the detection parameter, when a model-estimated voltage is corrected (possibly in near real time) by an error correction model, short circuit detection may be performed without necessarily storing voltage data before correction, and observation of cumulative values of the correction value may be appropriate to reflect an SOC difference for the corresponding section overall.

The variation factor may correspond to a discharge cut off voltage at an end point of a discharge state of a battery before CV charging is performed (and possibly before CC charging), and may correspond to a charge temperature in the target section. For example, the discharge cut off voltage may correspond to a battery voltage at the time point t0. The charge temperature may correspond to an average temperature of the target section, or a temperature of a predetermined time point (for example, the time point t2 or the time point t3) of the target section. In the case where there is a sustained short circuit state, the SOC cumulative correction amount may show a tendency to increase (in absolute value) in the CV charging section as the voltage estimation error increases. In a charging method using a fixed charging profile, a factor that affects an SOC value estimated during CV charging may be a discharge cut off voltage (or discharge depth) or a charge temperature. Therefore, a condition for evaluating a change in the discharge cut off voltage and the charge temperature (in an effective section) may be diversified by taking into consideration an actual battery usage condition, and an SOC cumulative correction amount in the CV charging section (based on the corresponding condition) may be obtained by testing a normal battery cell and a short circuit battery cell. For example, the short circuit battery cell may be configured to have a short circuit resistance value controlled by an external resistance. The SOC cumulative correction amount and the corresponding condition may be included in a reference data set.

Figure 4:
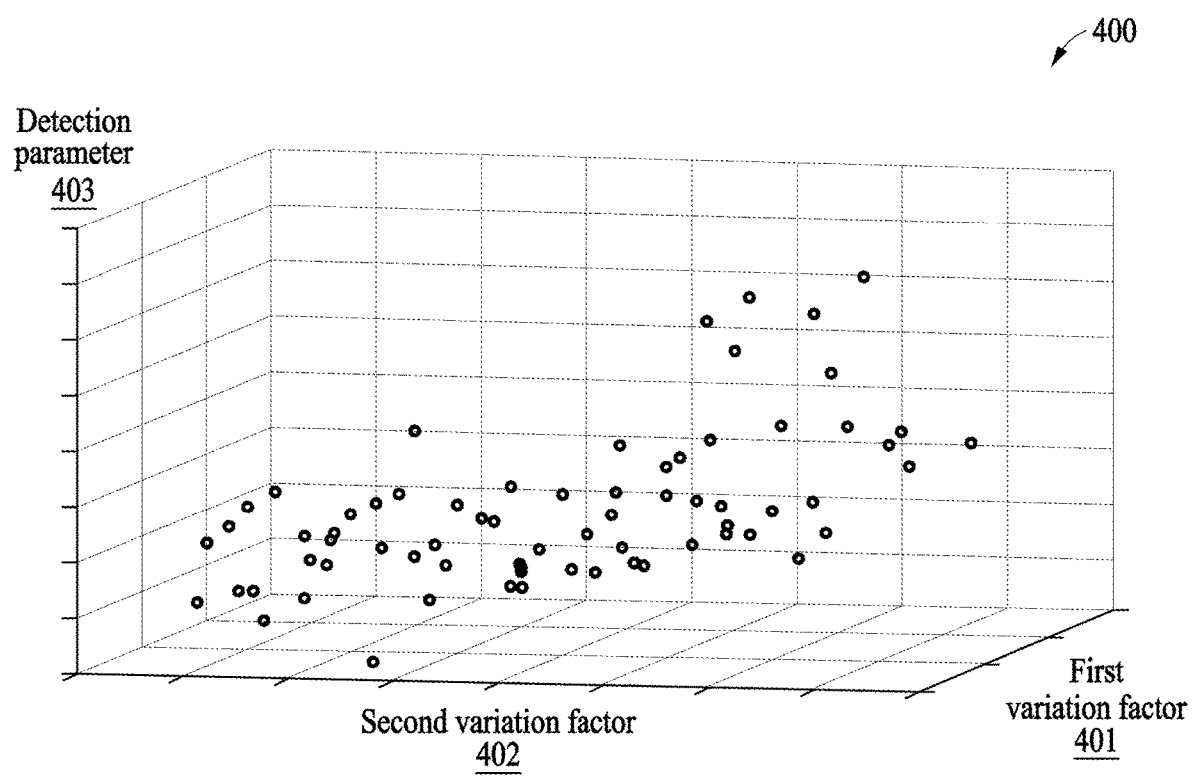
FIG. 4 illustrates an example of a reference data set including a detection parameter and a variation factor, according to one or more embodiments.

FIG. 4 illustrates an example of a reference data set including a detection parameter and a variation factor, according to one or more embodiments. Referring to FIG. 4, a point in graph 400 may represent a data element (e.g., a row) of a reference data set (see FIG. 5). The data element/row may include a parameter item (value) of a detection parameter field and a factor item (value) of a variation factor field. The variation factor may include a first variation factor and a second variation factor with reference to FIG. 4. For example, the detection parameter may be a change in an SOC cumulative correction value in a target section during which CV charging is performed, a first variation factor may be a charge temperature in the target section, and a second variation factor may be a discharge cut off voltage at an end point of a discharge state of a battery before CV charging is performed. Each data element may be represented as a point in a three-dimensional space of graph 400 based on each item value. In graph 400, the x-axis 401 may correspond to the first variation factor, the y-axis 402 may correspond to the second variation factor, and the z-axis 403 may correspond to the detection parameter.

A short circuit detection apparatus may determine values of the detection parameter and of the variation factor based on battery data measured during battery driving by extracting the values from the reference data. The value(s) extracted for the variation factor may be referred to herein as a reference value, which corresponds to the extracted detection parameter value. A battery short circuit may be detected based comparing the detection parameter value and the reference value (e.g., by evaluating their difference against the threshold described above). The detection parameter value and the variation factor value based on the battery data may be referred to as input data. For example, the input data may correspond to (x1, y1, z1) in graph 400; x1 may represent a charge temperature value, y1 may represent a cut off voltage value, and z1 may represent a change in a cumulative correction value. The short circuit detection apparatus may extract from the reference data set a data element (e.g., row) having a factor item (value(s) of a reference factor field(s)) which is close to the variation factor and may extract a parameter item (value of the detection parameter field) from the extracted data element as a reference value. For example, a predetermined number of data elements in an order close to (x1, y1) on an xy-plane may be extracted, and values of parameter items (detection parameter values) of the extracted data elements may be compared to z1.

In an implementation where factor items include a plurality of factors having respective different weights, the short circuit detection apparatus may extract data elements based on a relative distance between a given data element and variation factors according to the weights. For example, to extract data elements in an order close to (x1, y1) on an xy-plane, different weights may be applied to a distance in an x-axis direction and a distance in a y-axis direction when comparing a distance between each point and (x1, y1). For example, in case a greater weight is applied to a charge temperature in the x-axis direction compared to a cut off voltage in the y-axis direction, a point, which is closer to the x-axis, among two points having the same distance to (x1, y1) on the xy-plane may be selected.

FIG. 5 illustrates an example of a series of reference data used for detecting a short circuit, according to one or more embodiments. Referring to Table 500 of FIG. 5, battery data may include a voltage, a current, and a temperature. The battery data may be measured from a battery. The voltage, current, and temperature are represented by variables MVi, Mii, and Mti, respectively. Variable i may represent a serial number. The serial number may present a flow of time (increases with time). In Table 500, variables such as MVi, Mli, and MTi may correspond to predetermined values, respectively. In case a discharging state of the battery ends before CV charging is performed, a discharge cut off voltage at a corresponding end point may be determined based on the battery data. The discharge cut off voltage may be represented by CVi. In addition, during a target section in which CV charging is performed, a change in an SOC cumulative correction value may be measured.

A candidate reference value may be extracted from a reference data set based on a variation factor. For example, the variation factor may correspond to a discharge cut off voltage and a charge temperature. The charge temperature may be determined based on a temperature MTi of the battery data. A data element (e.g., row) having a factor item (value) close to the variation factor value may be extracted from the reference data set, and a parameter item (value of the detection parameter) of the extracted data element may be determined to be the candidate reference value. Table 500 may represent an example of three candidate reference values being extracted, however, a different number of candidate reference values may be extracted. The detection parameter value may be compared to the candidate reference value, and a short circuit state may be determined based on the comparison result. For example, "0" may represent a normal state (a state without a short circuit), and "1" may represent a short circuit state, and the comparison may depend on the value of the short/normal state.

Figure 6:
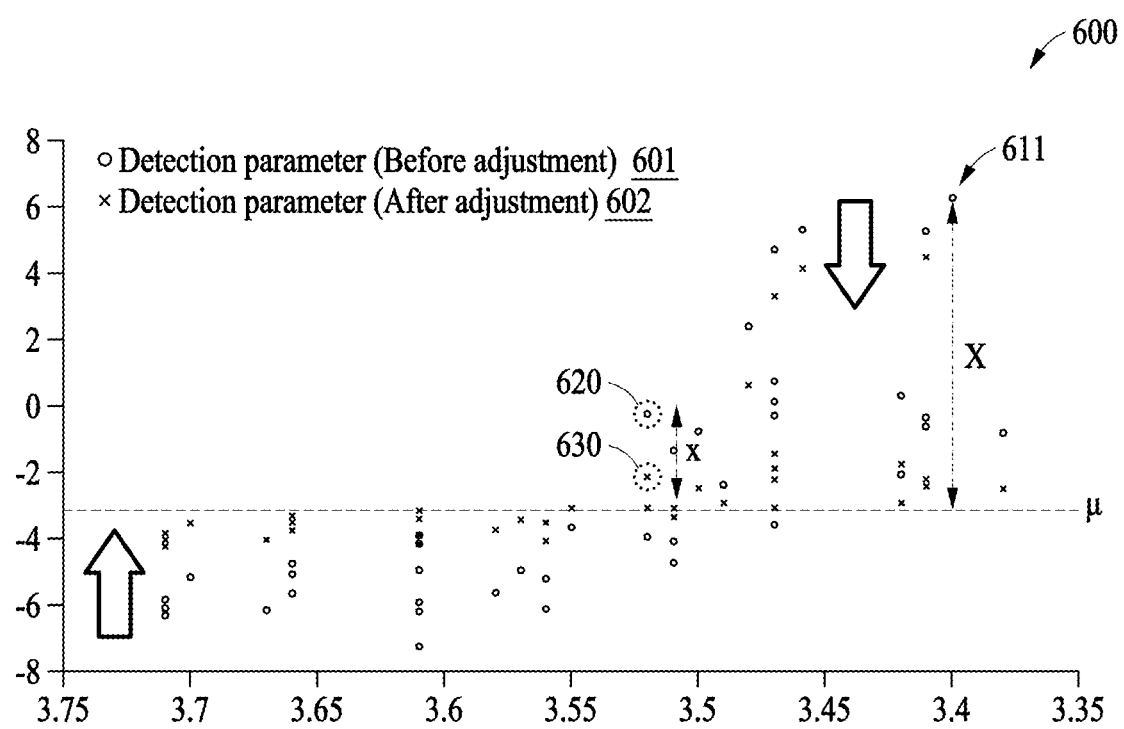
FIG. 6 illustrates an example of adjusting a detection parameter value, according to one or more embodiments.

FIG. 6 illustrates an example of adjusting a detection parameter, according to one or more embodiments. A reference data set may be determined based on a preliminary experimental result, may be determined based on an actual driving result during a sample driving section of a battery, or may be determined by applying the actual driving result to the preliminary experimental result. The sample driving section may represent an initial section (for example, initial 50 cycles of a charge/discharge section) in which the battery starts being driven in an actual use environment. FIG. 6 may correspond to an operation of applying the actual driving result to the preliminary experimental result.

Referring to FIG. 6, a graph 600 may include detection parameters 601 before adjustment and detection parameters 602 after adjustment. For example, the detection parameters 601 may correspond to the preliminary experimental result. The detection parameters 601 may be adjusted to the detection parameters 602 based on the actual driving result. The actual driving result may be obtained by driving the battery during a sample period in an actual use environment of the battery, such as an electronic device (for example, a smartphone) in which the battery is mounted, and a reference data set may be determined by adjusting the preliminary experimental result based on statistical data (for example, average data) based on the actual driving result.

The detection parameters 601 may be adjusted based on Equation 1 shown below, for example.

$$P2 = \mu + x * \text{abs}\left[\frac{x}{X}\right] \quad \text{[Equation 1]}$$

In Equation 1, P2 denotes the detection parameters 602, μ denotes an average value of detection parameters based on an actual driving result, x denotes a difference between the detection parameters 601 and μ, and X denotes a maximum difference between the detection parameters 602 and μ. For example, x corresponds to a distance between a detection parameter 620 and μ, and X corresponds to a distance between a detection parameter value 611 and μ. Based on adjustment by Equation 1, the detection parameter value 620 may be adjusted to a detection parameter value 630.

Figure 7:
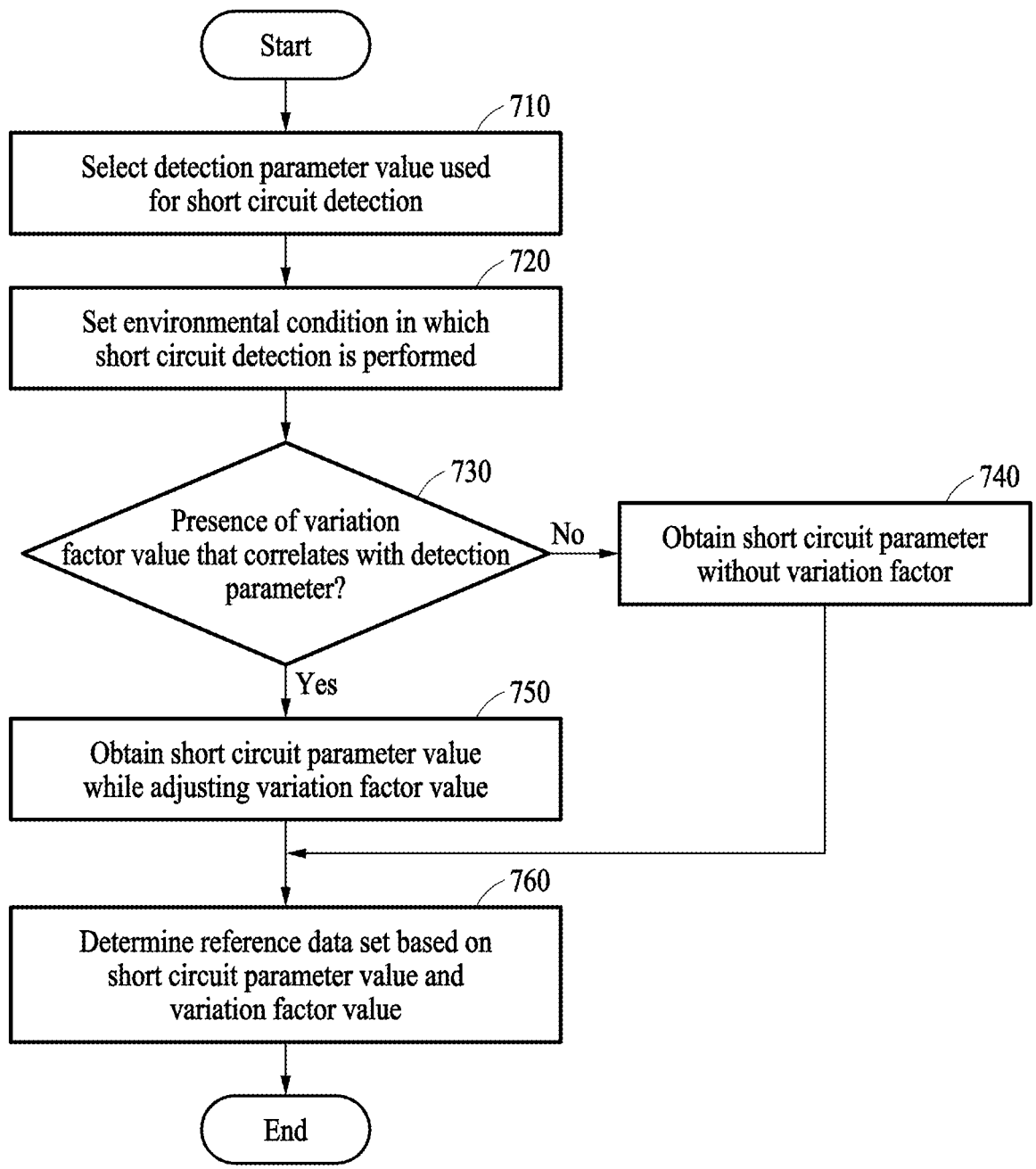
FIG. 7 illustrates an example of determining a reference data set, according to one or more embodiments.
Figure 8:
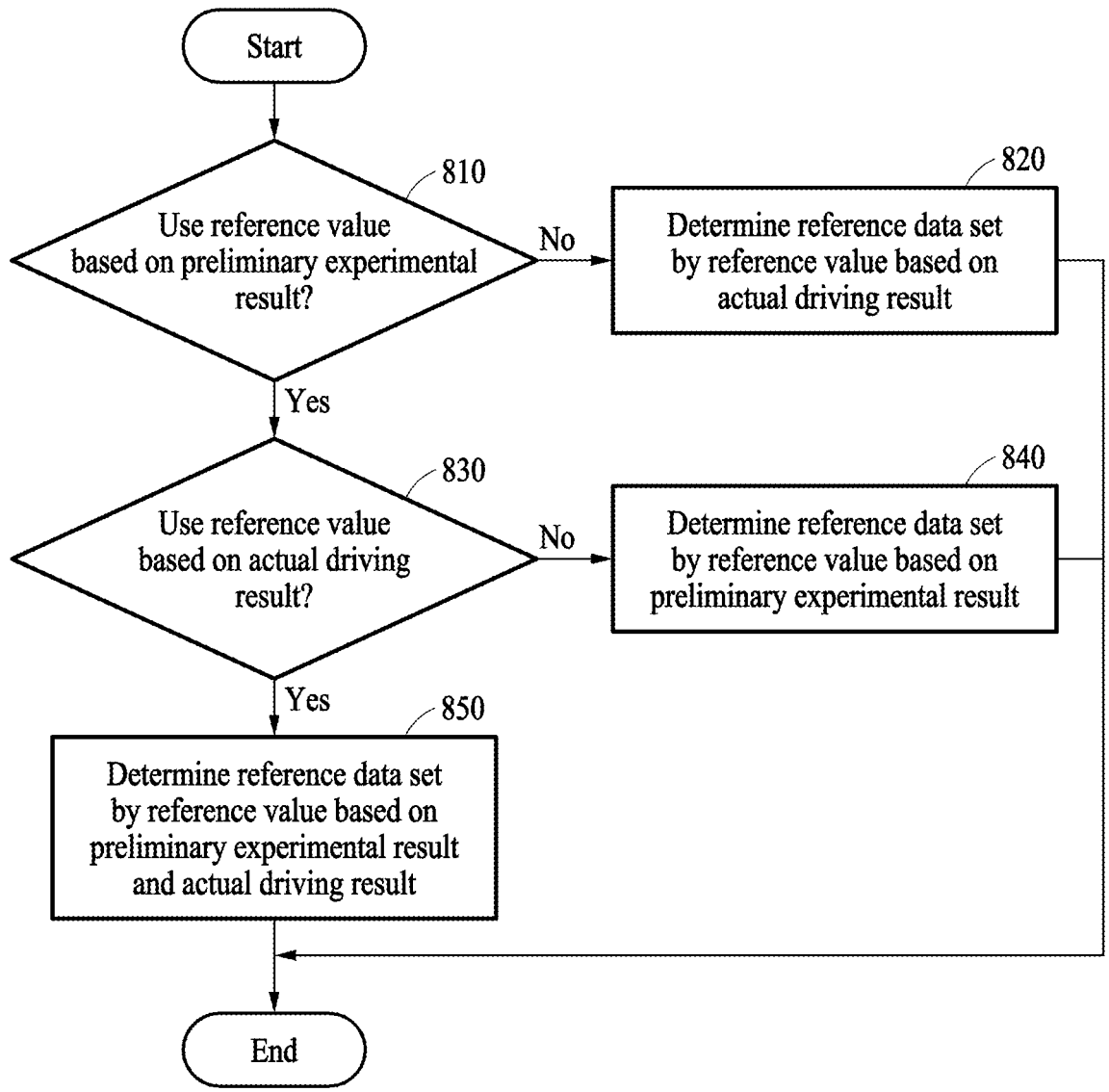
FIG. 8 illustrates an example of determining a reference data set, according to one or more embodiments.

FIGS. 7 and 8 illustrate an example of an operation of determining a reference data set. Referring to FIG. 7, in operation 710, a short circuit detection apparatus may select a detection parameter to be used for short circuit detection. For example, the detection parameter may be selected to correspond to a change in an error in voltage estimation, a change in a cumulative error in voltage estimation, a change in a correction value of a voltage error, a change in a cumulative correction value of a voltage error, a voltage change, a current change, a capacity change, a temperature change, a short circuit resistance value, or a short circuit current value, for example.

In operation 720, the short circuit detection apparatus may set an environmental condition in which short circuit detection is performed. The short circuit detection apparatus may obtain a reference data set in the set environmental condition and may perform short circuit detection using the reference data set in a corresponding environment. For example, a short circuit detection environment may include a charge/discharge range (for example, a time range, a speed range, a voltage range) and a temperature range.

In operation 730, the short circuit detection apparatus may determine whether a variation factor that affects the detection parameter is present. The variation factor may correspond to a charge/discharge temperature, a charge/discharge range (for example, a voltage range), or a charge/discharge speed, for example. If the variation factor is not present, in operation 740, the short circuit detection apparatus may obtain a short circuit parameter without the variation factor. Otherwise, if the variation factor is present, in operation 750, the short circuit detection apparatus may obtain a short circuit parameter while adjusting (varying) the variation factor.

In operation 760, the short circuit detection apparatus may determine a reference data set based on the short circuit parameter and the variation factor. If the variation factor is present, each data element/row of the reference data set may include both the short circuit parameter and the variation factor. If the variation factor is not present, each data element/row of the reference data set may include only the short circuit parameter.

Referring to FIG. 8, in operation 810, the short circuit detection apparatus may determine whether a reference value based on a preliminary experimental result is used. If the reference value based on the preliminary experimental result is not used, in operation 820, the short circuit detection apparatus may determine the reference data set by a reference value based on an actual driving result. In operation 830, the short circuit detection apparatus may determine whether the reference value based on the actual driving result is used. If the reference value based on the actual driving result is not used, in operation 840, the short circuit detection apparatus may determine the reference data set by the reference value based on the preliminary experimental result.

If both the reference value based on the preliminary experimental result and the reference value based on the actual driving result are used, in operation 850, the short circuit detection apparatus may determine the reference data set by a reference value based on the preliminary experimental result and the actual driving result. The short circuit detection apparatus may adjust the reference value based on the preliminary experimental result based on the reference value based on the actual driving result. The short circuit detection apparatus may determine a reference value based on the preliminary experimental result and/or the actual driving result based on operations 710 to 760.

Figure 9:
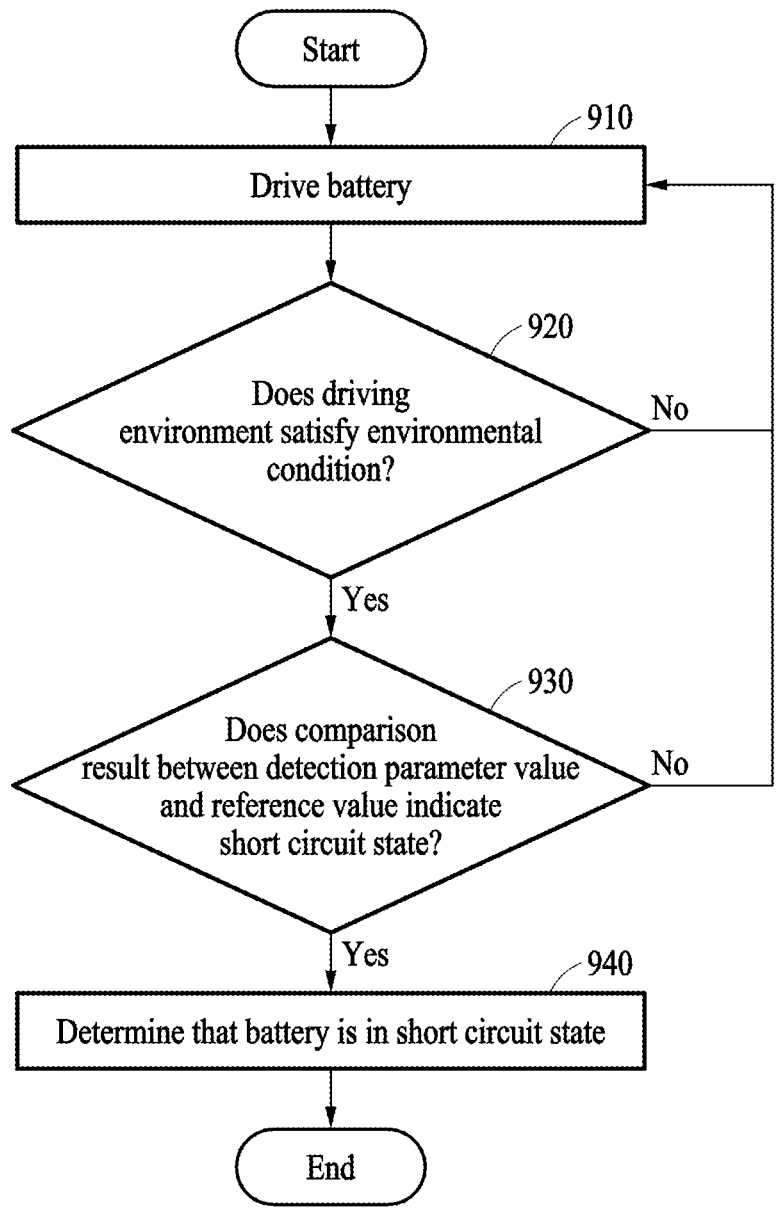
FIG. 9 illustrates an example of detecting a short circuit using reference data, according to one or more embodiments.

FIG. 9 illustrates an example of detecting a short circuit using reference data, according to one or more embodiments. Referring to FIG. 9, in operation 910, a battery is driven. In operation 920, a short circuit detection apparatus determines whether a driving environment for a battery satisfies an environmental condition. In case the driving environment satisfies the environmental condition, in operation 930, the short circuit detection apparatus may determine whether a comparison result between a detection parameter value and a reference value indicates a short circuit state. The short circuit detection apparatus may determine the detection parameter value and a variation factor value(s) based on battery data measured by the battery, may extract a reference value corresponding to the detection parameter from a reference data set by using the variation factor, and may detect a battery short circuit based on a comparison result between the detection parameter and the reference value. If the comparison result indicates the short circuit state, in operation 940, the short circuit detection apparatus may determine that the battery is in the short circuit state. The short circuit detection apparatus may perform a necessary action such as notifying a short circuit situation to a user, deactivating the battery, powering off a device incorporating the battery, a device using the battery entering a low power mode, modifying how the battery is driven, etc.

Figure 10:
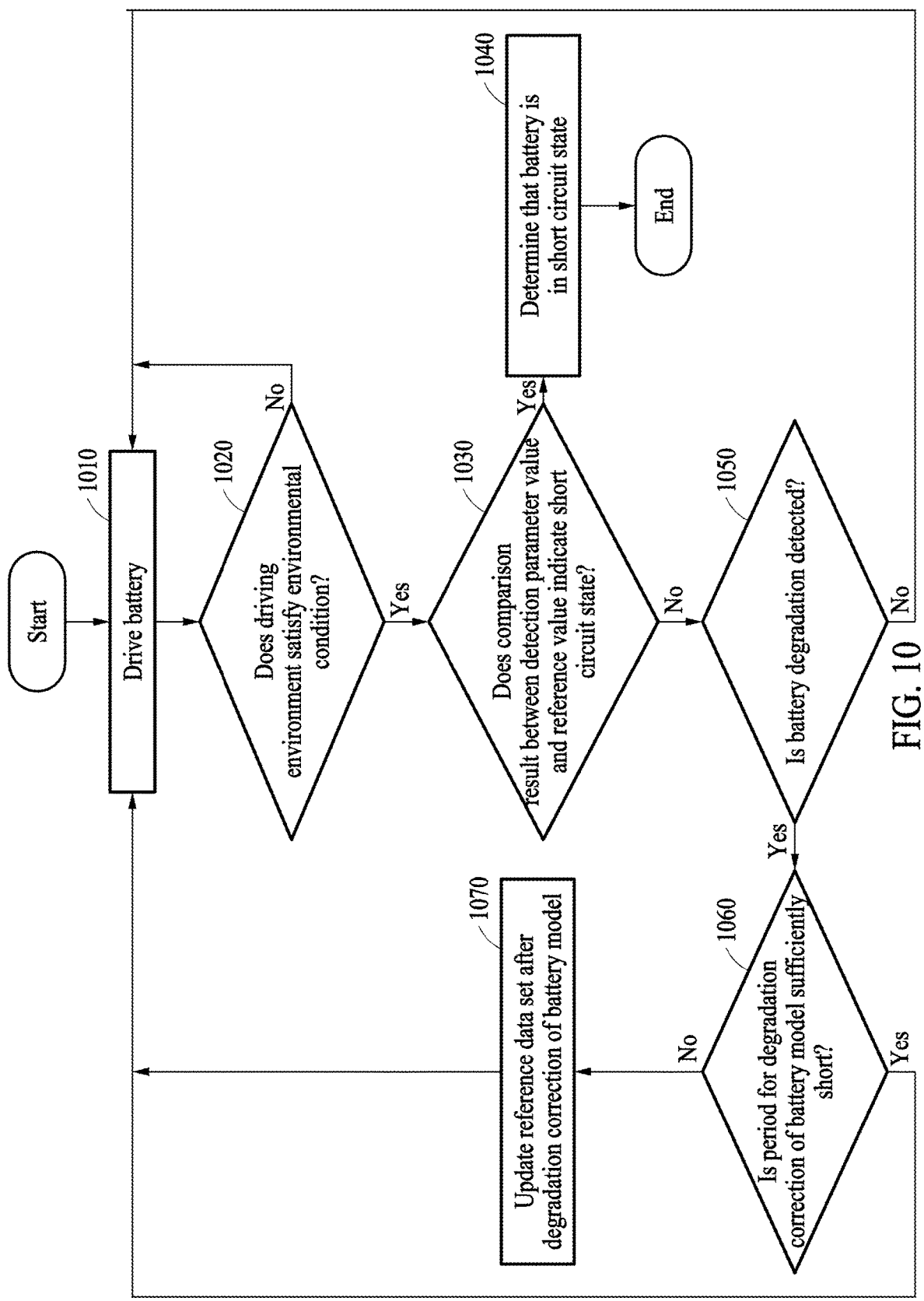
FIG. 10 illustrates an example of detecting a short circuit that considers degradation of a battery, according to one or more embodiments.

FIG. 10 illustrates an example of detecting a short circuit that considers degradation of a battery, according to one or more embodiments. Referring to FIG. 10, in operation 1010, a battery may be driven. In operation 1020, a short circuit detection apparatus may determine whether a driving environment satisfies an environmental condition, and in operation 1030, the short circuit detection apparatus may determine whether a comparison result between a detection parameter and a reference value indicates a short circuit state. In case the comparison result indicates the short circuit state, in operation 1040, the short circuit detection apparatus may determine that the battery is in the short circuit state.

If the comparison result does not indicate the short circuit state, in operation 1050, the short circuit detection apparatus may determine whether battery degradation is detected. The detection parameter may be affected by the variation factor as well as degradation of the battery. For example, in case of rapid battery degradation, an amount of cumulative SOC correction in a CV charging section may positively increase. In this case, the accuracy of short circuit detection may be helped by re-adjusting a reference data set after reflecting the battery degradation in a battery model used for short circuit detection. If a period for degradation correction of the battery model is sufficiently short, short circuit detection may be performed without re-adjustment since a degree of degradation is continuously reflected in the battery model and a battery state is estimated. In operation 1060, the short circuit detection apparatus may determine whether the period for degradation correction of the battery model is sufficiently short, and in operation 1070, the reference data set may be updated after degradation correction of the battery model.

Figure 11:
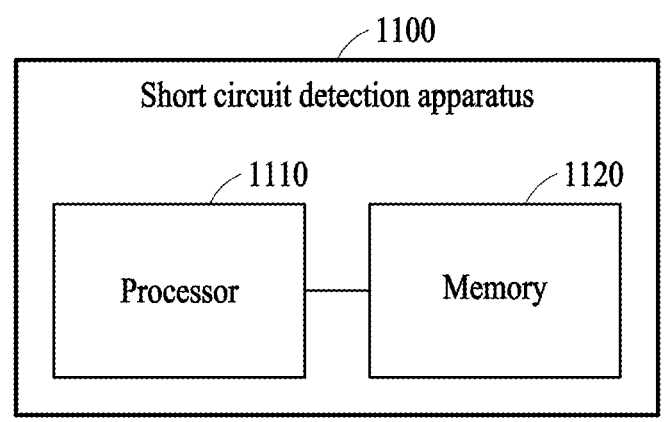
FIG. 11 illustrates an example of a short circuit detection apparatus, according to one or more embodiments.

FIG. 11 illustrates an example of a short circuit detection apparatus, according to one or more embodiments. Referring to FIG. 11, a short circuit detection apparatus 1100 includes a processor 1110 and a memory 1120. The memory 1120 may be connected to the processor 1110, and store instructions executable by the processor 1110, data to be processed by the processor 1110, or data processed by the processor 1110. The memory 1120 may include a non-transitory computer-readable medium, for example, high-speed random-access memory (RAM), and/or a nonvolatile computer-readable storage medium (e.g., one or more disk storage devices, flash memory devices, or other nonvolatile solid state memory devices).

The processor 1110 may execute instructions to perform the operations described herein with reference to FIGS. 1 to 10, FIG. 12, and FIG. 13. For example, the processor 1110 may determine a variation factor that affects a detection parameter and the detection parameter used for detecting a battery short circuit, based on battery data measured by the battery, may extract a reference value corresponding to the detection parameter from a reference data set by using the variation factor, and may detect a battery short circuit based on a comparison result between the detection parameter and the reference value. In addition, the description provided with reference to FIGS. 1 to 10, FIG. 12, and FIG. 13 may be applicable to the short circuit detection apparatus 1100.

Figure 12:
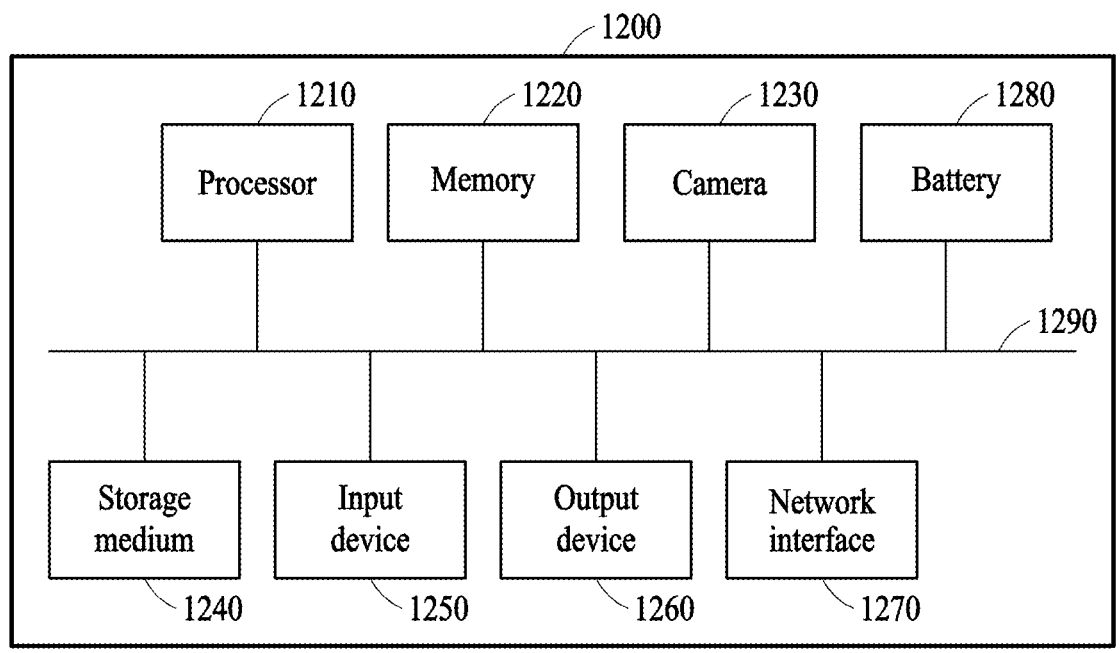
FIG. 12 illustrates an example of an electronic apparatus, according to one or more embodiments.

FIG. 12 illustrates an example of an electronic apparatus, according to one or more embodiments. Referring to FIG. 12, an electronic apparatus 1200 may include a processor 1210, a memory 1220, a camera 1230, a storage device 1240, an input device 1250, an output device 1260, a network interface 1270, and a battery 1280, and these components may communicate with one another via a communication bus 1290. For example, the electronic apparatus 1200 may be implemented as, or at least as a portion of, for example, a mobile device such as a mobile phone, a smartphone, a personal digital assistant (PDA), a netbook, a tablet computer, a laptop computer, and the like, a wearable device such as a smart watch, a smart band, smart glasses, and the like, a home appliance such as a television (TV), a smart TV, a refrigerator, and the like, a security device such as a door lock and the like, and a vehicle such as an autonomous vehicle, a smart vehicle, and the like. The electronic apparatus 1200 may structurally and/or functionally include the short circuit detection apparatus 100 of FIG. 1 and/or a short circuit detection apparatus 1100 of FIG. 11.

For example, the processor 1210 and memory 1220 may respectively correspond to the processor 1110 and memory 1120 of FIG. 11.

The processor 1210 executes instructions or functions to be executed by the electronic device 1200. For example, the processor 1210 may process the instructions stored in the memory 1220 or the storage device 1240. The processor 1210 may perform one or more, or all, of the operations or methods described herein with reference to FIGS. 1 to 13. The memory 1220 may include a computer-readable storage medium or a computer-readable storage device. The memory 1220 may store instructions to be executed by the processor 1210 and may store related information while software and/or an application is executed by the electronic device 1200.

The camera 1230 may capture a photo and/or a video. For example, the camera 1230 may capture a face image including a face of a user. The camera 1230 may be a three-dimensional (3D) camera including depth information associated with objects. The storage device 1240 may include a computer-readable storage medium or computer-readable storage device. The storage device 1240 may store more information than the memory 1220 for a long time. For example, the storage device 1240 may include a magnetic hard disk, an optical disc, a flash memory, a floppy disk, or other non-volatile memory known in the art.

The input device 1250 may receive an input from the user in traditional input manners through a keyboard and a mouse, and in new input manners such as a touch input, a voice input, and an image input. For example, the input device 1250 may include a keyboard, a mouse, a touch screen, a microphone, or any other device that detects the input from the user and transmits the detected input to the electronic device 1200. The output device 1260 may provide an output of the electronic device 1200 to the user through a visual, auditory, or haptic channel. The output device 1260 may include, for example, a display, a touch screen, a speaker, a vibration generator, or any other device that provides the output to the user. The network interface 1270 may communicate with an external device through a wired or wireless network. The battery 1280 may store power, and may supply the power to the electronic apparatus 1200.

Figure 13:
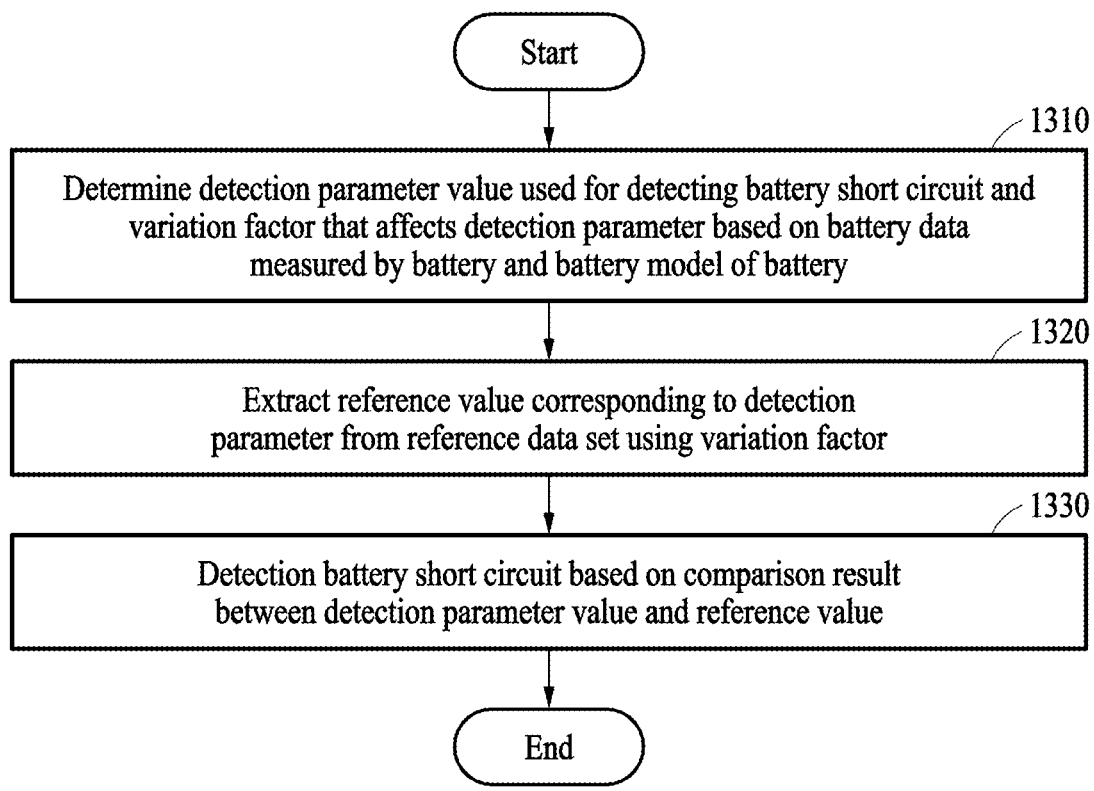
FIG. 13 illustrates an example of detecting a short circuit, according to one or more embodiments.

FIG. 13 illustrates an example of detecting a short circuit, according to one or more embodiments. Referring to FIG. 13, in operation 1310, a short circuit detection apparatus may determine a detection parameter value used for detecting battery short circuit and a variation factor that affects the detection parameter based on battery data measured by a battery and a battery model of the corresponding battery. In operation 1320, the short circuit detection apparatus may extract a reference value corresponding to the detection parameter from a reference data set by using the variation factor. In operation 1330, the short circuit detection apparatus may detect a battery short circuit based on a comparison result between the detection parameter value and the reference value. In addition, the description provided with reference to FIGS. 1 to 12 may be applicable to the short circuit detection method.

The computing apparatuses, the vehicles, the electronic devices, the processors, the memories, the image sensors, the vehicle/operation function hardware, the ADAS/AD systems, the displays, the information output system and hardware, the storage devices, and other apparatuses, devices, units, modules, and components described herein with respect to FIGS. 1-13 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIM D) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-Res, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A processor-implemented method comprising:
    based on battery data measured by a battery and a battery model of the battery, determining a detection parameter value used for detecting a short circuit of the battery and a variation factor value correlated with the detection parameter;
    using the variation factor to extract a reference value corresponding to the detection parameter value from a reference data set; and
    determining whether a short circuit of the battery has occurred based on a result of comparing the detection parameter value with the reference value.

2. The processor-implemented method of claim 1, wherein the detection parameter value corresponds to either a change in an error in voltage estimation, a change in a cumulative error in voltage estimation, a change in a correction value of a voltage error, a change in a cumulative correction value of a voltage error, a voltage change, a current change, a capacity change, a temperature change, a short circuit resistance value, or a short circuit current value.

3. The processor-implemented method of claim 2, wherein a battery model is used to obtain the detection parameter value.

4. The processor-implemented method of claim 1, wherein the detection parameter value corresponds to a change in a cumulative correction value of a state of charge (SOC) during a target time period of constant voltage (CV) charging, and
    the variation factor comprises a discharge cut off voltage and/or a charge temperature of the target time period.

5. The processor-implemented method of claim 4, wherein the change in the cumulative correction value corresponds to a difference between a first cumulative correction value at a start point of the target time period and a second cumulative correction value at an end point of the target time period.

6. The processor-implemented method of claim 4, wherein the cumulative correction value is determined by determining a voltage estimation value by using a battery model, determining an estimation error by comparing the voltage estimation value to a voltage measurement value, and accumulating SOC correction values that reduce the estimation error.

7. The processor-implemented method of claim 1, wherein each data element of the reference data set comprises a respective parameter value corresponding to the detection parameter value and a factor value related to the variation factor value, and
    the extracting of the reference value comprises:
        extracting a data element comprising the factor item, which is selected from the reference data set based on a proximity to the variation factor; and
        extracting the parameter item of the selected data element as the reference value.

8. The processor-implemented of claim 7, wherein the factor value comprises a plurality of values having respective weights, and the extracting of the data element comprises extracting the data element based on a distance between the data element and the variation factor, wherein the distance is based on the weights.

9. The processor-implemented method of claim 1, wherein the reference data set corresponds to a state without a short circuit, and
the detecting of the short circuit comprises determining that the battery is in a short circuit state when a difference between the detection parameter and the reference value is greater than a threshold.

10. The processor-implemented method of claim 1, further comprising:
updating a battery model based on modeled degradation of the battery; and
updating the reference data set by using the updated battery model,
wherein the detection parameter value is determined based on estimated values estimated by using the battery model.

11. The processor-implemented method of claim 1, wherein the reference data set is determined based on a preliminary experimental result, is determined based on an actual driving result during a sample driving of the battery, or is determined by applying the actual driving result to the preliminary experimental result.

12. The processor-implemented method of claim 1, further comprising:
obtaining an actual driving result by driving the battery during a sample period; and
determining the reference data set by adjusting a preliminary experimental result based on statistical data based on the actual driving result.

13. A non-transitory computer-readable storage medium storing instructions that, when executed by a processor, cause the processor to perform the method of claim 1.

14. An apparatus comprising:
a processor configured to:
based on battery data measured from a battery and a battery model of the battery, determine a detection parameter value used for detecting a short circuit of the battery and a variation factor value correlated with the detection parameter;
using the variation factor value, extract a reference value corresponding to the detection parameter value from a reference data set; and
detect a short circuit of the battery based on a result of comparing the detection parameter value with the reference value.

15. The apparatus of claim 14, wherein the detection parameter value corresponds to a change in an error in voltage estimation, a change in a cumulative error in voltage estimation, a change in a correction value of a voltage error, a change in a cumulative correction value of a voltage error, a voltage change, a current change, a capacity change, a temperature change, a pre-calculated short circuit resistance value, or a pre-calculated short circuit current value.

16. The apparatus of claim 14, wherein the detection parameter value corresponds to a change in a cumulative correction value of a state of charge (SOC) during a target time period for which constant voltage (CV) charging is performed, and
the variation factor comprises a discharge cut off voltage and/or a charge temperature of the target time period.

17. The apparatus of claim 14, wherein each data element of the reference data set comprises a parameter value corresponding to the detection parameter value and a factor value corresponding to the variation factor value, and
the processor is further configured to:
extract a data element comprising the factor value, which is close to the variation factor, from the reference data set; and
extract the parameter value of the data element as the reference value.

18. The apparatus of claim 14, wherein the reference data set corresponds to a state of the battery without a short circuit, and
the processor is further configured to determine that the battery is in a short circuit state when a difference between the detection parameter value and the reference value is greater than a threshold.

19. The apparatus of claim 14, further comprising the battery.

20. The apparatus of claim 14, wherein the detection parameter value corresponds to a change in a cumulative correction value of a state of charge (SOC), and
the variation factor value comprises a discharge cut off voltage and/or a temperature.

21. The apparatus of claim 14, wherein the reference data set comprises elements, and wherein each data element comprises a respective parameter value corresponding to the detection parameter and a respective factor value corresponding to the variation factor value, and
the processor is further configured to select a data element from the reference data set based on a proximity thereof to the variation factor value, and use the parameter value of the selected data element as the reference value.

22. The apparatus of claim 14, wherein the apparatus is a smartphone comprising a camera.

23. A method comprising:
applying a received measurement of a battery to a battery model to obtain a voltage estimate;
comparing the voltage estimate to a measured voltage of the battery to obtain an error of the voltage estimate;
obtaining a correction value that corrects the obtained error of the voltage estimate with respect to the measured voltage; and
determining that the battery is in a short circuit state based on the correction value.

24. The method of claim 23, wherein the determining that the battery is in a short circuit state comprises obtaining, from reference data associated with the battery, a reference value corresponding to the correction value, and wherein the determining is further based on the reference value.

25. The method of claim 24, wherein the reference value corresponds to an accumulation of reference correction values.

26. The method of claim 24, wherein the reference data comprises elements comprising respective measures of the battery over time, and wherein each element has a respectively corresponding detection parameter value, reference parameter value, and candidate reference value.

27. The method of claim 26, further comprising selecting an element from the reference data, and determining that the battery is in a short circuit state based further on the candidate reference value of the selected element.

28. The method of claim 23, further comprising:
taking a remediation action based on determining that the battery is in a short circuit state, wherein the remediation action comprises generating a notification, changing an operation state of a computing device powered by the battery, or adjusting a feature of the battery.

* * * * *